(12) United States Patent
Akai

(10) Patent No.: US 6,716,662 B2
(45) Date of Patent: Apr. 6, 2004

(54) PRODUCTION METHOD FOR ORGANIC ELECTROLUMINESCENT DEVICE

(75) Inventor: Tomonori Akai, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/202,058

(22) Filed: Jul. 25, 2002

(65) Prior Publication Data

US 2003/0045021 A1 Mar. 6, 2003

(30) Foreign Application Priority Data

Aug. 30, 2001 (JP) ........................................ 2001-261619

(51) Int. Cl.[7] ............................................. H01L 51/40
(52) U.S. Cl. ............................. 438/99; 438/29; 257/40; 257/103
(58) Field of Search .................... 257/40, 103; 438/29, 438/99

(56) References Cited

U.S. PATENT DOCUMENTS

| | | | | |
|---|---|---|---|---|
| 5,399,502 A | * | 3/1995 | Friend et al. | ................. 438/22 |
| 5,981,306 A | * | 11/1999 | Burrows et al. | ............... 438/22 |
| 6,114,088 A | * | 9/2000 | Wolk et al. | ............... 430/273.1 |
| 2002/0036297 A1 | * | 3/2002 | Pichler | ........................ 257/103 |

FOREIGN PATENT DOCUMENTS

| | | |
|---|---|---|
| JP | 8-185984 | 7/1996 |
| JP | 9-167684 | 6/1997 |
| JP | 10-125469 | 5/1998 |
| JP | 10-208881 | 8/1998 |
| JP | 10-294182 | 11/1998 |
| JP | 10-308284 | 11/1998 |
| JP | 11-329753 | 11/1999 |

* cited by examiner

Primary Examiner—Richard Elms
Assistant Examiner—Christian D. Wilson
(74) Attorney, Agent, or Firm—Nixon & Vanderhye P.C.

(57) ABSTRACT

A production method for an organic electroluminescent device includes the steps of: forming a first electrode on a substrate, forming an organic film including a light emitting layer on the first electrode, forming an electrically conductive and light transmissive protection layer on the organic film, and forming a transparent second electrode on the protection layer by a sputtering method.

14 Claims, 7 Drawing Sheets

PRODUCTION METHOD FOR ORGANIC ELECTROLUMINESCENT DEVICE

CROSS-REFERENCE TO RELATED APPLICATION

This application is related to Japanese Patent Application No. 2001-261619 filed in Aug. 30, 2001, whose priority is claimed under 35 USC §119, the disclosure of which is incorporated by reference in its entirety.

BACKGROUND OF THE INVENTION

1. Field of the Invention

The present invention relates to a production method for an organic electroluminescent device, an electroluminescent device produced by such a production method, and an organic electroluminescent display panel employing such an organic electroluminescent device.

2. Description of the Related Art

Organic electroluminescent devices (organic EL devices) are light emitting devices typically including a first electrode, an organic film comprising at least a light emitting layer, and a second electrode, which are stacked in this order on a substrate. In recent years, the organic EL devices, which are expected to be applied to display panels, have been under intensive studies in various fields.

When a voltage is applied between the first and second electrodes of the organic EL device, electrons are injected into the light emitting layer of the organic film from one of the electrodes, and holes are injected into the light emitting layer from the other electrode. Thus, the electrons are coupled with the holes to provide facial light emission from the light emitting layer.

To provide the facial light emission, it is desirable that one of the electrodes is transparent. In most cases, a transparent substrate is employed as the substrate, and a transparent electrode film is formed as the fist electrode on the transparent substrate, so that the light emission can be outputted from the side of the first electrode. That is, the organic EL device includes the transparent first electrode, the organic film including at least the light emitting layer, and the transparent or non-transparent second electrode, which are stacked in this order on the transparent substrate.

A reason why the light emission is outputted from the first electrode side in the conventional organic EL device is that a glass substrate formed with an ITO conductive film for general use in a liquid crystal display panel and the like is used as the substrate for the organic EL device. The term "ITO" stands for tin indium oxide, and the ITO film is generally employed as a transparent electrode.

The recent research and development is directed to an organic EL device which is adapted to output light emission from a second electrode side opposite from a substrate thereof for improvement of the characteristics and efficiencies of the organic EL device. More specifically, the organic EL device includes a transparent or non-transparent first electrode, an organic film comprising at least a light emitting layer, and a transparent second electrode, which are stacked in this order on a transparent or non-transparent substrate, so that facial light emission from the light emitting layer is outputted through the transparent second electrode.

This arrangement leads to improvement in light emitting efficiency and reduction in power consumption, because a loss in light emission can be suppressed which may otherwise occur due to reflection on the substrate in the case of the conventional device adapted to output the light emission from the first electrode side.

In addition, there is a wide choice of materials for the substrate. That is, a non-transparent substrate such as a ceramic substrate or a silicon substrate can be employed.

Where a display panel incorporating organic EL devices in pixel light emitting sections thereof is driven by TFTs (thin film transistors), the aperture ratio of the display panel is advantageously improved.

Figure 5:
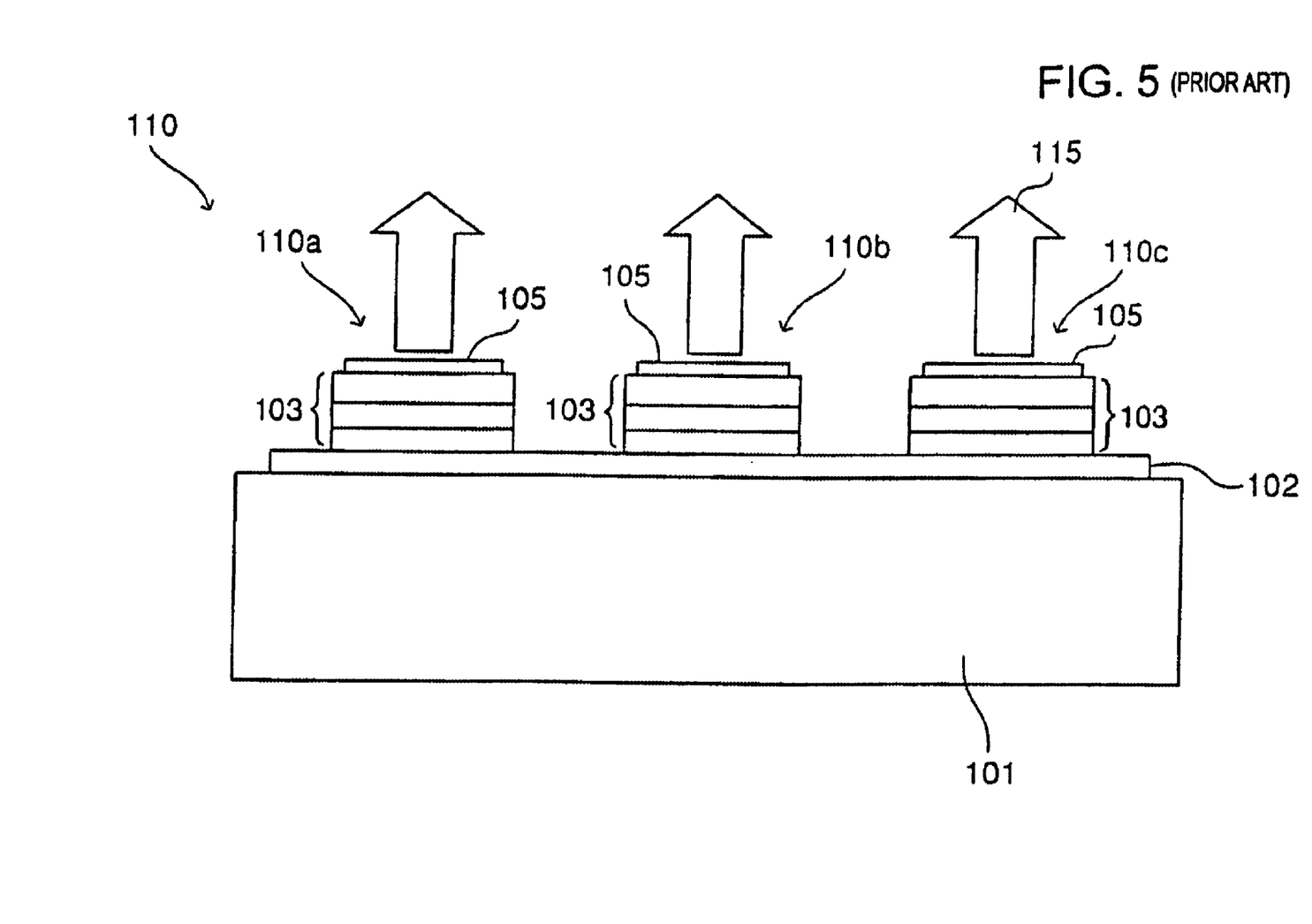
FIG. 5 is an explanatory diagram schematically illustrating the construction of an organic EL display panel incorporating therein conventional organic EL devices.
Figure 6:
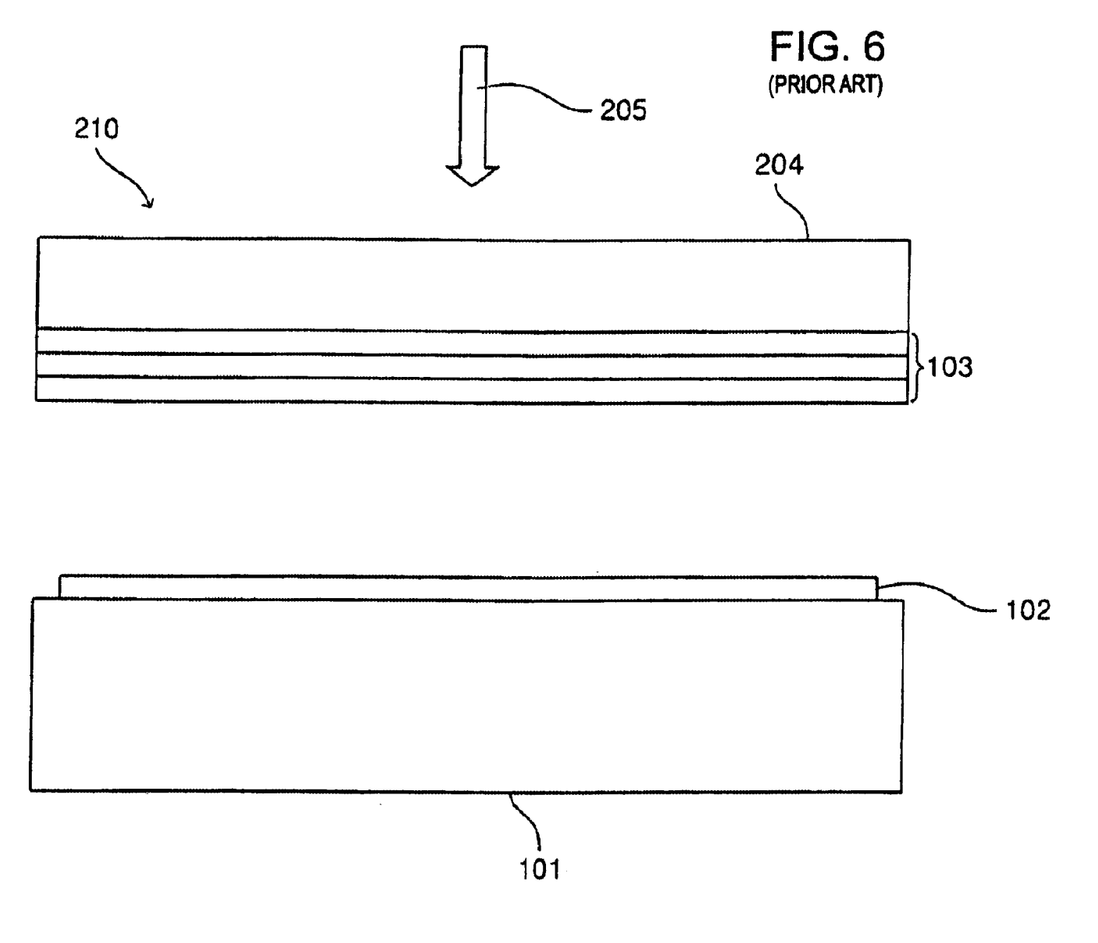
FIG. 6 is a diagram for explaining the step of forming organic films on first electrodes of the organic EL devices shown in FIG. 5 by a transfer method.
Figure 7:
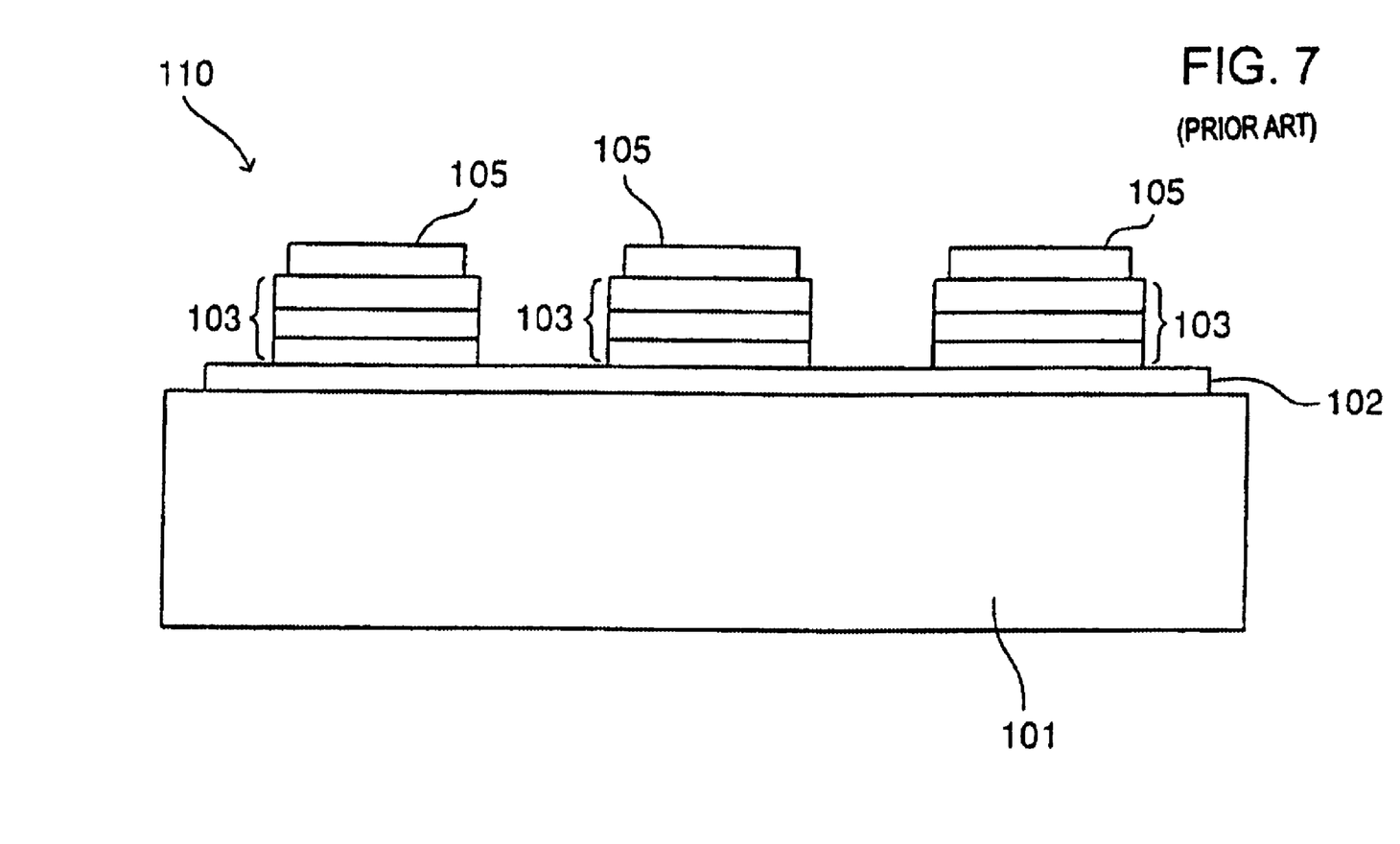
FIG. 7 is a diagram for explaining the step of forming second electrodes on the organic films of the conventional organic EL devices shown in FIG. 5.

With reference to FIGS. 5 to 7, an explanation will be given to the construction of the organic EL display panel which includes conventional organic EL devices adapted to output light emission from a second electrode side, and to a production method therefor.

FIG. 5 is an explanatory diagram schematically illustrating the construction of the organic EL display panel (organic EL display) which includes the conventional organic EL devices adapted to output the light emission from the second electrode side. FIG. 6 is a diagram for explaining the step of forming organic films on first electrodes of the conventional organic EL devices shown in FIG. 5 by a transfer method, and FIG. 7 is a diagram for explaining the step of forming second electrodes on the transferred organic films.

The conventional organic EL display panel 110 shown in FIG. 5 includes organic EL devices 110a, 110b, 110c. The organic EL devices 110a, 110b, 110c each include a common substrate 101, a first electrode 102, an organic film 103 comprising at least a light emitting layer, and a second electrode 105.

For production of the organic EL display panel 110, the first electrode 102 and the second electrode 105 are each formed in a predetermined pattern. Where the organic EL display panel is of a full color type, the organic films 103 of the respective organic EL devices 110a, 110b and 110c should be formed separately for red (R), green (G) and blue (B) light emission.

The substrate 101 and the first electrodes 102 of the conventional organic EL devices 110a, 110b, 110c are not required to be transparent, but at least the second electrodes 105 on the respective organic films 103 are required to be transparent, because the light emission is outputted from the side of the second electrodes 105.

The formation of the organic films 103 on the first electrodes 102 is achieved by a known method such as an evaporation method, a spin coating method, a printing method, a laminating method or an ink jet method. In recent years, a transfer method has attracted attention.

In the transfer method, a donor film is prepared by forming a thin film (an organic film to be transferred onto the first electrode) on a base film such as a PET (polyethylene terephthalate) film by an evaporation method, a spin coating method or a sputtering method. The donor film is applied onto the substrate, and irradiated with an energy such as a laser beam or heat from the side of the base film thereof, whereby irradiated portions of the thin film are transferred onto the substrate (see, for example, Japanese Unexamined Patent Publications No. 9(1997)-167684 and No. 10(1998)-208881).

The base film is not limited to the aforesaid PET film but, where a laser beam is employed as a heat source, a PET film formed with a light-to-heat conversion layer and a heat conduction layer is preferably used.

An advantage of the transfer method is that layers of the thin film stacked on the base film are transferred onto the substrate as they are in a reverse stacking order. Therefore, the layers of the thin film (layers of the organic film) can collectively be formed on the substrate.

Further, there is no need to pattern the thin film on the base film, but it is merely necessary to form the thin film on the entire base film.

Since only the portions of the thin film irradiated with the laser beam or the heat are transferred from the donor film onto the substrate, the organic film can be formed in a highly precise pattern on the substrate without the use of a shadow mask as employed in the evaporation method. For example, the transfer method can easily form a line pattern having a width of 200 µm or smaller. Therefore, a more precise organic EL display panel can more easily be produced than in the case where the conventional shadow mask is employed.

For the aforesaid reasons, the transfer method is advantageous for the production of the organic EL display panel.

With reference to FIG. 6, a more specific explanation will be given to the step of forming the organic films 103 of the conventional organic EL devices 110a, 110b, 110c shown in FIG. 5 by the transfer method.

As shown in FIG. 6, a donor film 210 including an organic film 103 provided over a base film 204 and comprising at least a light emitting layer is applied on a substrate 101 formed with first electrodes 102, and a heat source 205 is scanned over the donor film 210 perpendicularly to the first electrodes 102 for irradiation of the donor film 210 from the side of the base film 204. Thus, portions of the organic film 103 irradiated with the heat source 205 are transferred onto the first electrodes 102.

This step is repeated with the use of a donor film having a light emitting layer for red light emission, with the use of a donor film having a light emitting layer for green light emission, and with the use of a donor film having a light emitting layer for blue light emission, whereby the organic films 103 respectively adapted to emit red, green and blue light rays are transferred onto the first electrodes.

Then, transparent second electrodes 105 are formed on the respective organic films 103. Thus, the organic EL display panel 110 is produced as shown in FIG. 7.

As described above, most of the organic electroluminescent devices conventionally employ the ITO conductive film as the transparent first electrode formed on the substrate. The ITO conductive film is formed by an electron beam method or a sputtering method, and subjected to a heat treatment for improvement in the transmissivity and electrical conductivity thereof.

Where the transparent ITO conductive film is formed as the first electrode on the substrate by the aforesaid formation method, there is no particular problem. However, where the transparent ITO conductive film is formed as the second electrode on the organic film, the organic film underlying the second electrode is damaged because the organic film is less resistant to the electron beam method and the sputtering method. Therefore, the organic EL device cannot properly be produced.

Where the ITO conductive film is formed on the organic film by the sputtering method, for example, the organic film is easily damaged by a temperature increase due to the sputtering because of its lower heat resistance. Further, the organic film is damaged by impingement of evaporated material particles. In such a case, the organic EL device suffers from a leak current or a reduction in luminous characteristics. In the worst case, the organic EL device fails to provide light emission.

Particularly, where the organic film is formed by the transfer method, the heat resistance of the organic film is reduced as compared with the case where the organic film is formed by a vacuum evaporation method or a spin coating method. This is because the organic film is instantaneously subjected to heat in the transfer thereof. Therefore, the organic film is heavily damaged by the heat treatment performed after the ITO conductive film is formed as the second electrode by the sputtering method on the organic film formed by the transfer method.

It is known that the damage to the organic film can be suppressed by employing a transparent conductive film of $In_2O_3$—ZnO (IDIXO (registered trade name) available from Idemitsu Kosan Co., Ltd.) as the second electrode (see, for example, Japanese Unexamined Patent Publication No. 10(1998)-294182). In the case of the IDIXO transparent conductive film, there is no need for the post-sputtering heat treatment.

IDIXO comprises about 10 wt % of zinc oxide (ZnO) and the balance of indium oxide ($In_2O_3$), and has a sufficient electrical conductivity and a sufficient transmissivity even if the heat treatment is not performed after the sputtering.

However, the organic film is damaged to some extent as long as the second electrode is formed of IDIXO by the sputtering method.

SUMMARY OF THE INVENTION

In view of the foregoing, the present invention is directed to a production method for an organic EL device adapted to output light emission from the side of a transparent second electrode provided on an organic film, the production method featuring suppression of damage to the organic film which may be caused when the transparent second electrode is formed on the organic film by a sputtering method. The invention is further directed to an organic electroluminescent device produced by such a production method, and to an organic electroluminescent display panel employing such an organic electroluminescent device.

The present invention provides a production method for an organic electroluminescent device, the method comprising the steps of: forming a first electrode on a substrate; forming an organic film including a light emitting layer on the first electrode; forming an electrically conductive and light transmissive protection layer on the organic film; and forming a transparent second electrode on the protection layer by a sputtering method.

According to the present invention, the damage to the organic film which may be caused when the transparent second electrode is formed by the sputtering method is suppressed by forming the protection layer on the organic film and then forming the transparent second electrode on the protection layer by the sputtering method.

DETAILED DESCRIPTION OF THE INVENTION

In accordance with the present invention, a production method for an organic EL device comprises the steps of: forming a first electrode on a substrate; forming an organic film including a light emitting layer on the first electrode; forming an electrically conductive and light transmissive protection layer on the organic film; and forming a transparent second electrode on the protection layer by a sputtering method.

In the organic EL device production method according to the present invention, the substrate to be used may be transparent or non-transparent. A material for the substrate is not particularly limited, as long as the substrate is sufficiently rigid to retain the organic EL device. Examples of the substrate include silicon substrates, polyimide films, ceramic substrates, glass substrates, and insulated metal substrates.

The first electrode may be transparent or non-transparent, and exemplary materials for the first electrode include thin films composed of metals such as aluminum, magnesium, lithium, calcium, gold, platinum, copper and nickel, and thin films composed of electrically conductive transparent materials such as ITO, ZnO and $SnO_2$.

A thin film for the first electrode may be formed by a known method such as an evaporation method, a sputtering method, an electron beam method or a plating method, and patterned by a known method. The patterning method is not particularly limited, but a shadow mask method or a photolithography method may be employed.

The first electrode has a thickness of about 50 nm to about 1 $\mu$m, which may vary depending on the material for the first electrode.

The construction of the organic film is not particularly limited, as long as the organic film includes at least the light emitting layer. For example, the organic film includes an electron injection layer, an electron transportation layer, the light emitting layer, a hole transportation layer and a hole injection layer, which are stacked in this order on the first electrode.

Exemplary materials for the light emitting layer include tris(8-hydroxynate)aluminum (Alq3), bis(2-methyl-8-quinolinolato)(p-phenylphenolato)aluminum (BAlq), benzoxazole materials, and benzothiazole materials.

The light emitting layer may be doped with quinacridone, rubrene, 4-dicyanomethylene-2-methyl-6-(p-dimethylaminostyryl)-4H-pyrane (DCM) or a cumarin derivative for changing the color of the light to be emitted and improving the characteristics of the light emitting layer.

Exemplary materials for the electron injection layer and the electron transportation layer include oxadiazole derivatives, tris(8-hydroxynate)aluminum (Alq3) and triazole derivatives.

Exemplary materials for the hole injection layer and the hole transportation layer include N,N'-diphenyl-4,4'-diamine (TPD), N,N'-diphenyl-N,N'-(3-methylphenyl)-1,1'-biphenyl-4,4'-diamine ($\alpha$-NPD), copper phthalocyanine (CuPc), oxadiazole materials, pyrazoline materials and hydrazone materials.

The formation of the respective layers of the organic film is achieved by a known method such as an evaporation method, a spin coating method, a printing method or an ink jet method.

The organic film has a thickness substantially equivalent to that of an organic film of an ordinary organic EL device, for example, a thickness of about 10 nm to about 1 $\mu$m.

In the organic EL device production method according to the present invention, the protection layer forming step may comprise the step of depositing a metal material for the formation of the protection layer, the metal material being capable of protecting the organic film when the second electrode is formed.

In the organic EL device production method according to the present invention, the protection layer forming step may comprise the step of depositing gold, nickel or aluminum to a thickness of about 1 nm to about 20 nm for the formation of the protection layer.

Although a metal film of gold, nickel or aluminum is intrinsically impervious to light, the protection layer of gold, nickel or aluminum is pervious to light because of its thickness reduced to about 20 nm.

However, the protection layer having the reduced thickness has a high electrical resistance and, therefore, does not sufficiently serve as an electrode. For reduction of the electrical resistance, it is necessary to form the transparent second electrode on the protection layer.

In the organic EL device production method according to the present invention, the second electrode forming step may comprise the step of depositing a material comprising indium oxide and zinc oxide (IDIXO (registered tradename) available from IDEMITSU KOSAN CO., LTD.) for the formation of the second electrode. Since the protection layer is formed on the organic film before IDIXO is deposited by a sputtering method, the organic film is not directly exposed to the sputtering. Hence, damage to the organic film can be suppressed. In addition, IDIXO does not require a post-sputtering heat treatment which may be required in the case of ITO, and yet has a sufficient transmissivity and a sufficient electrical conductivity. Therefore, the damage to the organic film can further be suppressed.

In the organic EL device production method according to the present invention, the second electrode forming step may comprise the step of depositing a second electrode material at a deposition rate of about 0.1 to about 1 nm/min for the formation of the second electrode. By reducing the deposition rate to about 0.1 to about 1 nm/min which is much lower than an ordinary deposition rate, the damage to the organic film can further be suppressed.

However, where the second electrode material is deposited to a thickness of about 100 nm at this deposition rate for the formation of the second electrode, the sputtering requires an excessively long period of time. This problem can be solved by increasing the deposition rate in the midst of the sputtering.

In the organic EL device production method according to the present invention, the second electrode forming step may comprise the step of depositing the second electrode material to a thickness of about 20 nm at a deposition rate of about 0.1 to about 1 nm/min and then to a desired thickness at a deposition rate of about 1 to about 5 nm/min for the formation of the second electrode.

After IDIXO is deposited to a certain thickness, the IDIXO film per se serves as a protective film. Therefore, the damage to the organic film can be prevented even if the deposition rate is thereafter increased.

In the organic EL device production method according to the present invention, the step of forming the organic film on the first electrode may comprise the step of applying a donor film comprising an organic film and a base film onto the first electrode with the organic film facing toward the first electrode, irradiating the donor film with a laser beam from the side of the base film to transfer an irradiated portion of the organic film onto the first electrode, and peeling the base film away from the first electrode for the formation of the organic film on the first electrode.

By employing the transfer method for the formation of the organic film, a more precise organic EL display panel can more easily be produced than in the case where the conventional shadow mask is employed.

In the production method, the laser beam to be employed for the irradiation of the donor film may be a YAG laser beam. By employing the YAG laser as the laser beam for the irradiation of the donor film, a locally intensive energy can be applied to the donor film, so that a more precise pattern can be formed. Where the laser beam is of a continuous wave type, a completely linear pattern can be transferred.

In the organic EL device production method according to the present invention, the protection layer forming step and the second electrode forming step may sequentially be performed in a vacuum atmosphere.

Where the protection layer is formed of a metal such as aluminum susceptible to oxidation, for example, the performance of the protection layer as an electrode can be prevented from being deteriorated. Where the protection layer is formed of a metal such as gold free from oxidation, for example, it is also preferred to sequentially perform the aforesaid two steps in the vacuum atmosphere so as to suppress damage to the organic film which may be caused by moisture and oxygen in the air.

In accordance with another aspect of the present invention, there is provided an organic EL device produced by the aforesaid inventive production method, the organic EL device comprising a substrate, a first electrode provided on the substrate, an organic film provided on the first electrode and including a light emitting layer, a protection layer provided on the organic film, and a second electrode provided on the protection layer.

In the organic EL device produced by the inventive production method, the protection layer may be adapted to change the wavelength of light emitted from the light emitting layer, and the light having the changed wavelength is outputted through the second electrode.

More specifically, the wavelength of the light to be outputted is dependent on the transmissivity of the protection layer, so that the wavelength of the light emitted from the light emitting layer can be changed. This improves the chroma of the light outputted from the organic EL device. Particularly, where the protection layer is formed of gold and blue light is to be outputted, the protection layer blocks a long wavelength component of the light emitted from the light emitting layer, thereby drastically improving the chroma of the outputted light.

In accordance with further another aspect of the present invention, there is provided an organic EL display panel which comprises a plurality of organic EL devices each produced by the inventive production method.

The organic EL display panel may further comprise thin film transistors for driving the respective organic EL devices.

An organic EL display panel and a production method therefor will hereinafter be described in detail with reference to the attached drawings, but the present invention will not be limited thereto.

Figure 1:
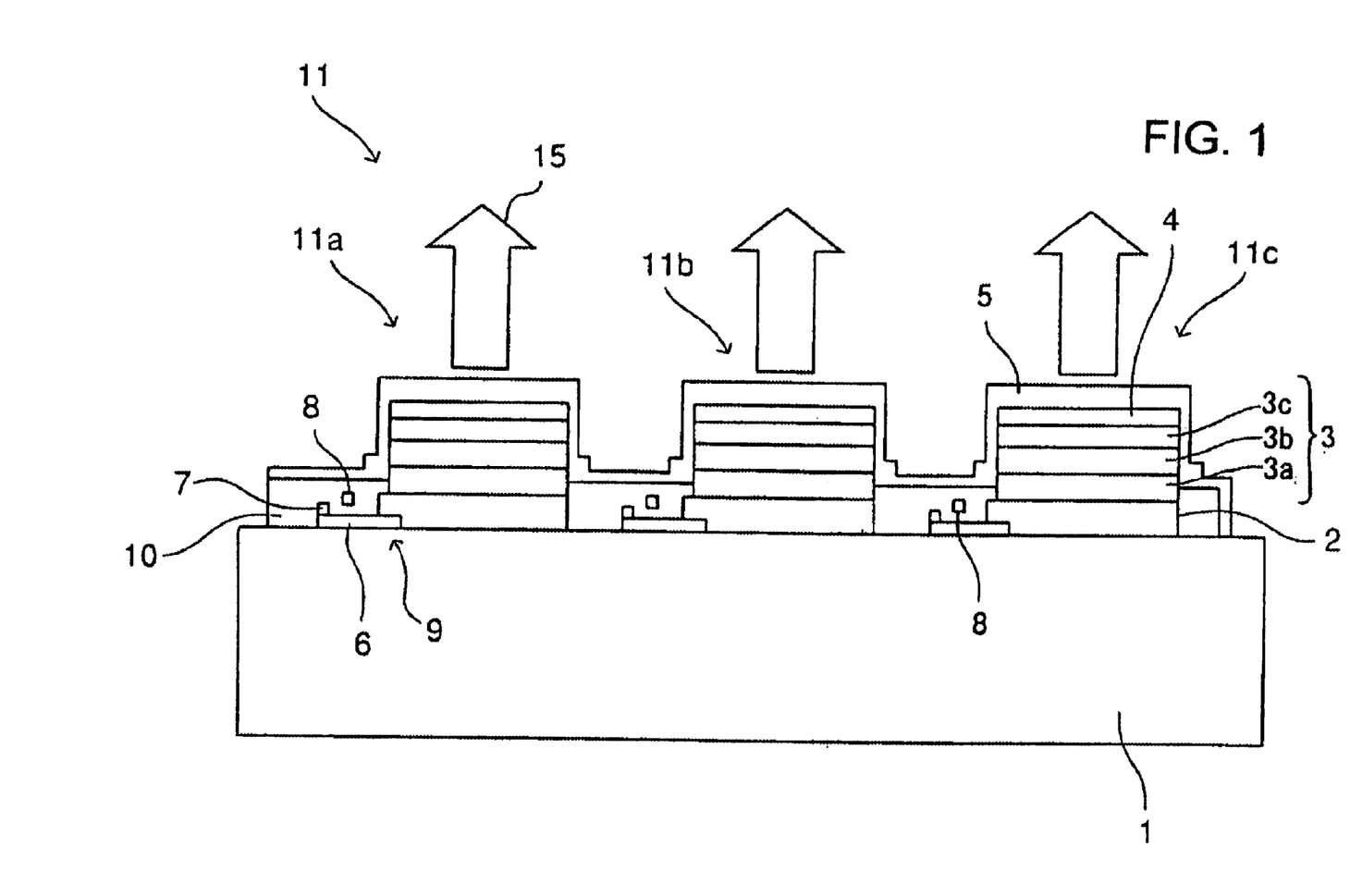
FIG. 1 is an explanatory diagram schematically illustrating the construction of an organic EL display panel according to the present invention.

An organic EL display panel 11 as shown in FIG. 1 includes organic EL devices 11a, 11b, 11c. The organic EL devices 11a, 11b, 11c each include a common substrate 1, a first electrode 2 provided on the substrate 1, an organic film 3 provided on the first electrode 2, a protection layer 4 provided on the organic film 3, and a transparent common second electrode 5 provided on the protection layer 4. The organic film 3 includes an electron injection and transportation layer 3a, a light emitting layer 3b, and a hole injection and transportation layer 3c, which are stacked in this order on the first electrode 2.

In amorphous silicon layers (or low temperature polysilicon) 6 formed on the substrate 1, TFTs (thin film transistors) 9 each having a source electrode 7 and a gate electrode 8 are provided for active driving of the respective organic EL devices 11a, 11b, 11c, and covered with a planarization film 10.

In FIG. 1, a reference numeral 15 denotes light emission. For the active driving, the transparent second electrode 5 is not required to be configured in a line pattern, but may uniformly be provided over the protection layer 4 except a lead terminal and a sealing portion (not shown).

With reference to FIGS. 2(a), 2(b), 3(c), 3(d), 4(e) and 4(f), an explanation will be given to a production method for the organic EL display panel 11 shown in FIG. 1.

1) Preparation of Transfer Donor Film 1-1) Preparation of Base Film

Figure 2:
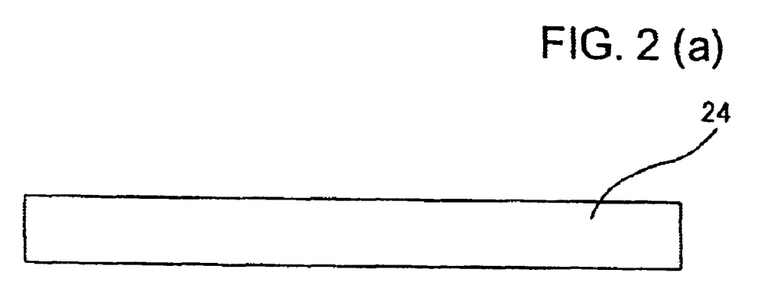
FIGS. 2(a) and 2(b) are process diagrams illustrating a production process for the organic EL display panel shown in FIG. 1.

As shown in FIG. 2(a), a transfer base film 24 is first prepared. A PET film, for example, is employed as the base film 24, but the base film 24 is not limited to a film form.

Among others, the PET film is advantageous as the base film 24 because of its excellent heat resistance and proper flexibility. The thickness of the base film 24 is not particularly limited, but preferably about 50 $\mu$m to about 1 mm in consideration of the durability of the donor film and the facilitation of the transfer.

Where the PET film is employed alone as the base film 24 and a laser beam (particularly, a YAG laser beam) is employed as a heat source for the transfer, the laser beam cannot efficiently be converted to heat, resulting in a poor transferability. Therefore, a light-to-heat conversion layer and a heat conduction layer may be formed on the base film 24, as required, by employing known materials for improvement of the efficiency of the transfer.

1-2) Formation of Organic Film

As shown in FIG. 2(b), an organic film 3 including a hole injection and transportation layer 3c, a light emitting layer 3b and an electron injection and transportation layer 3a is formed on the base film 24. Thus, a transfer donor film 21 is produced.

Here, the respective layers of the organic film 3 should be stacked on the base film 24 in a reverse order to how the layers are stacked on a substrate 1 when being transferred (see FIG. 1).

Where a full color display panel is to be produced which incorporates organic EL devices in pixel light emitting sections, organic films of organic EL devices in each pixel should respectively include a light emitting layer for red light emission, a light emitting layer for green light emission and a light emitting layer for blue light emission. Therefore, at least three donor films 21 for the red, green and blue light emission should be prepared.

The formation of the organic films 3 may be achieved by a known method such as an evaporation method, a spin coating method, a printing method or an ink jet method. The thickness of the organic films 3 is not particularly limited, but may be substantially equivalent to that of an organic film of an ordinary organic EL device, for example, about 10 nm to about 1 µm.

As described above, the organic film 3 includes the light emitting layer 3b, the hole injection and transportation layer 3c (which may include a hole transportation sublayer and a hole injection sublayer), the electron injection and transportation layer 3a (which may include an electron transportation sublayer and an electron injection sublayer). Materials for the respective layers are not particularly limited, but known materials may be employed.

Exemplary materials for the light emitting layer 3b include tris(8-hydroxynate)aluminum (Alq3), bis(2-methyl-8-quinolinolato)(p-phenylphenolato)aluminum (BAlq), benzoxazole materials, and benzothiazole materials.

The light emitting layer may be doped with quinacridone, rubrene, 4-dicyanomethylene-2-methyl-6-(p-dimethylaminostyryl)-4H-pyrane (DCM) or a cumarin derivative for changing the color of the light to be emitted and improving the characteristics of the light emitting layer.

Exemplary materials for the hole injection and transportation layer 3c include N,N'-diphenyl-4,4'-diamine (TPD), N,N'-diphenyl-N,N'-(3-methylphenyl)-1,1'-biphenyl-4,4'-diamine (α-NPD), copper phthalocyanine (CuPc), oxadiazole materials, pyrazoline materials and hydrazone materials.

Exemplary materials for the electron injection and transportation layer 3a include oxadiazole derivatives, tris(8-hydroxynate)aluminum (Alq3) and triazole derivatives.

The organic films 3 can be formed by employing the aforesaid materials. An organic film including at least a red light emitting layer, an organic film including at least a green light emitting layer and an organic film including at least a blue light emitting layer are separately formed on three base films.

2) Formation of Active Driving TFTs and Formation of First Electrode

Figure 3:
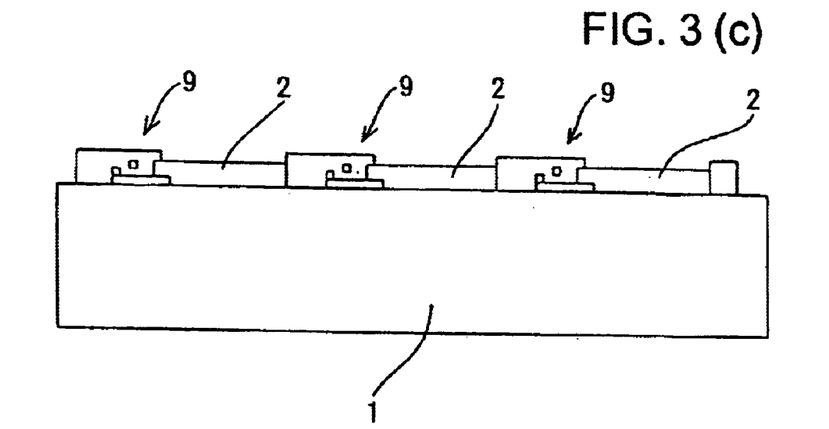
FIGS. 3(c) and 3(d) are process diagrams illustrating the production process for the organic EL display panel shown in FIG. 1.

As shown in FIG. 3(c), TFTs 9 for active driving are formed on the substrate 1.

Since the organic EL display panel 11 (see FIG. 1) is adapted to output light emission from the side of the second electrode 5, the substrate 1 is not required to be transparent. Therefore, the material for the substrate 1 is not particularly limited, as long as the substrate 1 is sufficiently rigid to retain the organic EL devices 11a, 11b, 11c.

Examples of the substrate include silicon substrates, polyimide films, ceramic substrates, glass substrates, and insulated metal substrates.

The TFTs 9 are formed of amorphous silicon or polysilicon on the substrate 1 by a known method.

After the formation of the TFTs 9, first electrodes 2 are formed on the substrate 1. Like the substrate 1, the first electrodes 2 are not required to be transparent. In most cases, a thin metal film is employed as a material for the first electrodes 2.

In ordinary organic EL devices, the thin metal film mostly functions as electron injection electrodes. In this case, a metal having a smaller work function is preferably employed as the material for the first electrodes 2 to facilitate injection of electrons. Examples of such a metal include aluminum, magnesium, lithium and calcium.

Where the thin metal film functions as hole injection electrodes, on the contrary, a metal having a greater work function is preferably employed as the material for the first electrodes 2 to facilitate injection of holes. Examples of such a metal include gold, platinum, copper and nickel. A transparent conductive film such as an ITO film may be employed instead of the metal film.

The thin metal film for the first electrodes 2 may be formed by a known method such as an evaporation method, a sputtering method, an electron beam method or a plating method, and patterned by a known method. The patterning method is not particularly limited, but a shadow mask method or a photolithography method may be employed.

The first electrodes 2 typically have a thickness of about 50 nm to about 1 µm, which may vary depending on the metal material for the first electrodes.

3) Transfer of Organic Film

As shown in FIG. 3(d), the donor film 21 is applied on the substrate 1 with the organic film 3 of the donor film 21 facing toward the first electrodes 2 on the substrate 1. Then, a heat source 25 such as a YAG laser beam is scanned over the donor film 21 from the side of the base film 24, so that the organic film 3 is transferred in a desired pattern onto the first electrodes 2. Thereafter, the base film 24 is peeled away.

The heat source 25 to be employed for the transfer of the organic film 3 is not particularly limited, as long as it ensures that the organic film 3 can properly be transferred onto the substrate 1. In order to provide a highly precise pattern, a locally intensive energy is preferably applied to the donor film 21, and the YAG laser beam is particularly preferred among other laser beams.

Where the laser beam is of a continuous wave type, the organic film 3 can be transferred in a completely linear pattern.

For the production of the full color organic EL display panel, the three donor films, i.e., the red, green and blue donor films, described in the section 1-2) are employed in this transfer step.

When the donor film 21 and the substrate 1 are combined together, the organic film 3 of the donor film 21 is brought into contact with the first electrode 2. At this time, the donor film 21 and the substrate 1 are pressed by means of a roller or the like so that no bubble is trapped in an interface therebetween. A vacuum laminating method is also effective for the removal of bubbles. When the base film 24 is peeled away after the transfer, the organic film 3 transferred in the desired pattern remains on the first electrode 2.

The transfer step is performed by employing the three donor films (red, green and blue donor films), whereby the organic films 3 respectively adapted to emit red, green and blue light rays are transferred in a stripe pattern on the first electrodes 2. The transferring order of the red, green and blue organic films is not particularly limited.

4) Formation of Protection Layer

Figure 4:
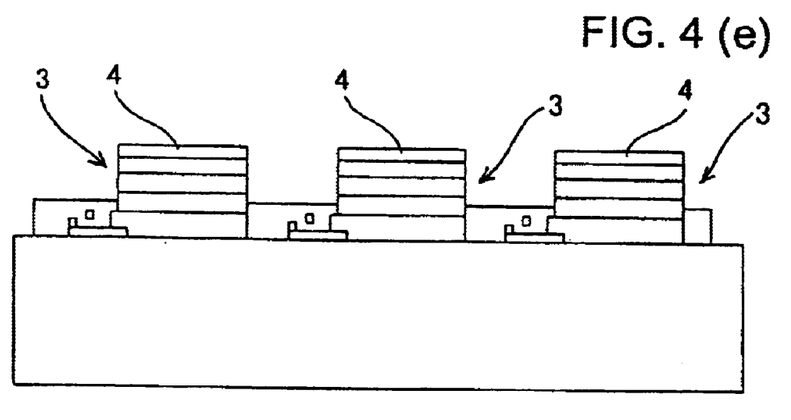
FIGS. 4(e) and 4(f) are process diagrams illustrating the production process for the organic EL display panel shown in FIG. 1.

As shown in FIG. 4(e), a protection layer 4 is formed on the organic films 3. Preferred examples of a material for the protection layer 4 include gold, aluminum and indium.

For injection of electrons into the organic films 3, a metal such as aluminum or indium having a smaller work function is employed. For injection of holes into the organic films 3, on the other hand, a metal such as gold or nickel having a greater work function is employed. In either case, the thickness of the protection layer 4 is not greater than about 20 nm.

The formation of the protection layer 4 is preferably achieved by a resistive heating evaporation method or an electron beam method.

5) Formation of Second Electrode

As shown in FIG. 4(f), a transparent second electrode 5 is formed on the resulting substrate by a sputtering method. Employed as a material for the second electrode 5 is IDIXO which has a sufficient transmissivity and a sufficient electrical conductivity without a post-sputtering heat treatment.

After the formation of the protection layer 4, the resulting substrate is moved into a sputtering apparatus while being kept in a vacuum atmosphere, and IDIXO is RF-sputtered. The sputtering is performed at a deposition rate of about 1 nm/min or lower for minimization of damage to the organic films 3.

If IDIXO is deposited to a thickness of about 100 nm at this deposition rate for the formation of the second electrode 5, however, the sputtering requires an excessively long period of time. Therefore, the deposition rate is increased when IDIXO is deposited to a thickness of about 20 nm. That is, the IDIXO film per se serves as a protective film after IDIXO is deposited to a certain thickness. Therefore, damage to the organic films 3 can be prevented even if the deposition rate is thereafter increased.

Thus, the transparent second electrode 5 of IDIXO is formed, whereby the organic EL display panel 11 is completed which is adapted to output light emission 15 from the side of the second electrode 5.

In order to ensure the reliability of the organic EL display panel 11, it is preferred to finally seal the organic EL display panel. A known method utilizing a hollow glass plate or film may be employed for the sealing.

In the organic EL device production method according to the present invention, the protection layer is formed on the organic film, and the transparent second electrode is formed on the protection layer by the sputtering method. Therefore, the damage to the organic film can be suppressed, which may otherwise occur when the transparent second electrode is formed by the sputtering method. This prevents the deterioration in the luminous characteristics of the organic EL device.

What is claimed is:

1. A production method for an organic electroluminescent device, the method comprising:

forming a first electrode so as to be supported by a substrate;

forming an organic film including a light emitting layer over the first electrode;

forming an electrically conductive and light transmissive protection layer comprising at least one of Au, Ni and Al directly on and contacting the organic film; and forming a transparent second electrode over the protection layer by a sputtering method.

2. A production method as set forth in claim 1, wherein the protection layer forming step comprises the step of depositing a metal material including at least one of Au, Ni and Al for the formation of the protection layer, the metal material being capable of protecting the organic film when the second electrode is formed.

3. A production method as set forth in claim 1, wherein the protection layer forming step comprises the step of depositing one of gold, nickel and aluminum to a thickness of 1 nm to 20 nm for the formation of the protection layer.

4. A production method as set forth in claim 1, wherein the second electrode forming step comprises the step of depositing a material comprising indium oxide and zinc oxide for the formation of the second electrode.

5. A production method as set forth in claim 1, wherein the second electrode forming step comprises the step of depositing a second electrode material at a deposition rate of 0.1 to 1 nm/min for the formation of the second electrode.

6. A production method as set forth in claim 1, wherein the second electrode forming step comprises the step of depositing a second electrode material to a thickness of 20 nm at a deposition rate of 0.1 to 1 nm/min and then to a desired thickness at a deposition rate of 1 to 5 nm/min for the formation of the second electrode.

7. A production method as set forth in claim 1, wherein the step of forming the organic film on the first electrode comprises the step of applying a donor film comprising an organic film and a base film onto the first electrode with the organic film facing toward the first electrode, irradiating the donor film with a laser beam from the side of the base film to transfer an irradiated portion of the organic film onto the first electrode, and peeling the base film away from the first electrode for the formation of the organic film on the first electrode.

8. A production method as set forth in claim 7, wherein the laser beam is a YAG laser beam.

9. A production method as set forth in claim 1, wherein the protection layer forming step and the second electrode forming step are sequentially performed in a vacuum atmosphere.

10. An organic electroluminescent device produced by a production method as recited in claim 1, the organic electroluminescent device comprising said substrate, said first electrode provided on the substrate, said organic film provided on the first electrode and including a light emitting layer, said protection layer comprising at least one of Au, Ni and Al provided directly on and contacting the organic film, and said second electrode provided on the protection layer.

11. An organic electroluminescent device as set forth in claim 10, wherein the protection layer changes a wavelength of light emitted from the light emitting layer, and the light having the changed wavelength is outputted through the second electrode.

12. An organic electroluminescent display panel comprising a plurality of organic electroluminescent devices as recited in claim 10.

13. An organic electroluminescent display panel as set forth in claim 12, further comprising thin film transistors for driving the respective organic electroluminescent devices.

14. The method of claim 1, wherein the protection layer changes a wavelength of light emitted from the light emitting layer, and the light having the changed wavelength is outputted through the second electrode.

* * * * *